US011737203B2

(12) United States Patent
Brandenburg et al.

(10) Patent No.: US 11,737,203 B2
(45) Date of Patent: *Aug. 22, 2023

(54) HEATSINK SHIELD WITH THERMAL-CONTACT DIMPLES FOR THERMAL-ENERGY DISTRIBUTION IN A RADAR ASSEMBLY

(71) Applicant: Aptiv Technologies Limited, St. Michael (BB)

(72) Inventors: Scott Brandenburg, Kokomo, IN (US); David Wayne Zimmerman, Noblesville, IN (US)

(73) Assignee: Aptiv Technologies Limited, St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 17/805,444

(22) Filed: Jun. 3, 2022

(65) Prior Publication Data
US 2022/0304139 A1    Sep. 22, 2022

Related U.S. Application Data

(63) Continuation of application No. 17/023,258, filed on Sep. 16, 2020, now Pat. No. 11,382,205.

(51) Int. Cl.
*H05K 1/02* (2006.01)
*H05K 7/20* (2006.01)
*G01S 7/02* (2006.01)

(52) U.S. Cl.
CPC ......... *H05K 1/0204* (2013.01); *H05K 1/0209* (2013.01); *G01S 7/027* (2021.05)

(58) Field of Classification Search
CPC ...... H05K 1/0204; H05K 1/0209; G01S 7/02; G01S 13/931; G01S 2013/93271; G01S 7/027

(Continued)

(56) References Cited

U.S. PATENT DOCUMENTS 4,987,425 A * 1/1991 Zahn ................. H01Q 21/0087
                                                            343/705
5,276,584 A    1/1994 Collins et al.
(Continued)

FOREIGN PATENT DOCUMENTS

CN    1864895 A    11/2006
CN    1877241 A    12/2006
(Continued)

OTHER PUBLICATIONS

"Extended European Search Report", EP Application No. 19180619.9, dated Nov. 19, 2019, 2 pages.
(Continued)

*Primary Examiner* — Anatoly Vortman
(74) *Attorney, Agent, or Firm* — Sawtooth Patent Group PLLC

(57) ABSTRACT

A heatsink shield with thermal-contact dimples can improve thermal-energy distribution in a radar assembly. The radar assembly includes a printed circuit board (PCB), the heatsink shield, a radome, and a housing. The PCB can include integrated circuits and other components, along with a thermally-conductive material that covers at least a portion of the PCB surfaces. The heatsink shield includes multiple dimples that thermally contact the thermally-conductive material. The heatsink shield is configured to distribute thermal energy produced at least in part by the PCB components to the housing. In this way, the described techniques and systems permit the radar assembly to better distribute thermal energy away from the PCB components to the rest of the PCB and through the housing.

20 Claims, 8 Drawing Sheets

(58) Field of Classification Search
USPC .......................................................... 361/719
See application file for complete search history.

(56) References Cited

U.S. PATENT DOCUMENTS

| | | | |
|---|---|---|---|
| 5,608,610 A | 3/1997 | Brzezinski | |
| 5,662,163 A * | 9/1997 | Mira | H01L 23/4006 |
| | | | 361/720 |
| 5,710,459 A * | 1/1998 | Teng | H01L 23/10 |
| | | | 257/E23.105 |
| 5,831,830 A * | 11/1998 | Mahler | H01Q 1/02 |
| | | | 174/16.3 |
| 5,960,861 A | 10/1999 | Price et al. | |
| 6,082,443 A | 7/2000 | Yamamoto et al. | |
| 6,317,326 B1 | 11/2001 | Vogel et al. | |
| 6,528,878 B1 | 3/2003 | Daikoku et al. | |
| 6,650,544 B1 | 11/2003 | Lai | |
| 6,901,994 B1 | 6/2005 | Jin-Cherng et al. | |
| 6,945,317 B2 | 9/2005 | Garner et al. | |
| 6,982,481 B1 * | 1/2006 | Sonderegger | H01L 23/4006 |
| | | | 257/713 |
| 7,019,971 B2 | 3/2006 | Houle et al. | |
| 7,032,652 B2 | 4/2006 | Wang et al. | |
| 7,230,832 B2 | 6/2007 | Brandenburg et al. | |
| 7,486,515 B2 | 2/2009 | Brandenburg et al. | |
| 8,004,844 B2 | 8/2011 | Kim et al. | |
| 8,045,329 B2 | 10/2011 | Chen et al. | |
| 8,074,706 B2 | 12/2011 | Su et al. | |
| 8,102,670 B2 | 1/2012 | Sakamoto et al. | |
| 8,176,972 B2 | 5/2012 | Mok | |
| 8,462,508 B2 | 6/2013 | Lankston et al. | |
| 8,659,892 B2 | 2/2014 | Yan et al. | |
| 8,699,225 B2 | 4/2014 | Brandenburg et al. | |
| 8,813,834 B2 | 8/2014 | Chin | |
| 8,857,502 B2 | 10/2014 | Huang | |
| 9,131,630 B2 | 9/2015 | Brandenburg et al. | |
| 9,696,068 B2 | 7/2017 | Matsunaga et al. | |
| 10,849,217 B2 | 11/2020 | Brandenburg et al. | |
| 10,910,706 B2 | 2/2021 | Hung et al. | |
| 10,973,151 B2 | 4/2021 | Wakaoka et al. | |
| 10,986,754 B2 | 4/2021 | Lee et al. | |
| 11,015,879 B2 | 5/2021 | Cai et al. | |
| 11,096,301 B2 * | 8/2021 | Mai | G01S 7/028 |
| 11,121,058 B2 | 9/2021 | Brandenburg et al. | |
| 2003/0168203 A1 | 9/2003 | Gektin et al. | |
| 2003/0173059 A1 | 9/2003 | Edelmann | |
| 2004/0130022 A1 | 7/2004 | Shizuno | |
| 2005/0022975 A1 | 2/2005 | Rosenfeld et al. | |
| 2005/0098300 A1 | 5/2005 | Kawabata et al. | |
| 2005/0190116 A1 | 9/2005 | Syed et al. | |
| 2005/0230085 A1 | 10/2005 | Valenzuela | |
| 2005/0280162 A1 | 12/2005 | Mok et al. | |
| 2006/0124281 A1 | 6/2006 | Rosenfeld et al. | |
| 2007/0025085 A1 * | 2/2007 | Chang | F28D 15/0233 |
| | | | 361/704 |
| 2007/0090737 A1 | 4/2007 | Hu et al. | |
| 2007/0127217 A1 | 6/2007 | Schwarz | |
| 2008/0062650 A1 | 3/2008 | Wilson et al. | |
| 2008/0137300 A1 | 6/2008 | Macris et al. | |
| 2008/0190586 A1 | 8/2008 | Robinson | |
| 2009/0151905 A1 | 6/2009 | Lai et al. | |
| 2010/0071879 A1 | 3/2010 | Hou | |
| 2010/0265709 A1 | 10/2010 | Liu | |
| 2010/0309940 A1 | 12/2010 | Lee | |
| 2011/0108142 A1 | 5/2011 | Liu et al. | |
| 2014/0083653 A1 | 3/2014 | Kempers et al. | |
| 2014/0268548 A1 | 9/2014 | Rice et al. | |
| 2014/0345843 A1 | 11/2014 | Kirkor et al. | |
| 2015/0198375 A1 | 7/2015 | Saito et al. | |
| 2016/0064355 A1 | 3/2016 | Pan et al. | |
| 2016/0276308 A1 | 9/2016 | Min et al. | |
| 2016/0343639 A1 * | 11/2016 | Groothuis | F28D 15/0233 |
| 2017/0092619 A1 | 3/2017 | Refai-Ahmed et al. | |
| 2017/0318702 A1 | 11/2017 | Basu et al. | |
| 2017/0338167 A1 | 11/2017 | Bozorgi | |
| 2018/0049349 A1 * | 2/2018 | Voss | H05K 7/20436 |
| 2018/0137300 A1 | 5/2018 | Shi et al. | |
| 2019/0014688 A1 | 1/2019 | Weibel et al. | |
| 2019/0141855 A1 | 5/2019 | Inagaki et al. | |
| 2019/0357387 A1 | 11/2019 | Peterson et al. | |
| 2020/0008291 A1 | 1/2020 | Brandenburg et al. | |
| 2020/0110155 A1 | 4/2020 | Cho et al. | |
| 2020/0221599 A1 | 7/2020 | Mai | |
| 2020/0275583 A1 | 8/2020 | Lee et al. | |
| 2021/0028088 A1 | 1/2021 | Brandenburg et al. | |
| 2021/0375718 A1 | 12/2021 | Brandenburg et al. | |

FOREIGN PATENT DOCUMENTS

| | | |
|---|---|---|
| CN | 202485508 U | 10/2012 |
| CN | 203807965 U | 9/2014 |
| CN | 205546384 U | 8/2016 |
| CN | 106653713 A | 5/2017 |
| CN | 106793685 A | 5/2017 |
| CN | 107044791 A | 8/2017 |
| CN | 107695318 A | 2/2018 |
| DE | 102012111184 A1 | 5/2014 |
| JP | 2018003957 A1 | 4/2019 |
| WO | 2017100568 A2 | 6/2017 |

OTHER PUBLICATIONS

"Extended European Search Report", EP Application No. 21191238.1, dated Jan. 25, 2022, 7 pages.

"Foreign Office Action", CN Application No. 201910547500.X, dated Apr. 1, 2020, 19 pages.

"Foreign Office Action", CN Application No. 201910547500.X, dated May 17, 2021, 16 pages.

"Foreign Office Action", EP Application No. 19180619.9, dated Jul. 5, 2021, 10 pages.

"Extended European Search Report", EP Application No. 22203717.8, dated Feb. 3, 2023, 9 pages.

* cited by examiner

HEATSINK SHIELD WITH THERMAL-CONTACT DIMPLES FOR THERMAL-ENERGY DISTRIBUTION IN A RADAR ASSEMBLY

CROSS-REFERENCE TO RELATED APPLICATION

This application is a continuation of U.S. patent application Ser. No. 17/023,258, filed Sep. 16, 2020, the entire disclosure of which is hereby incorporated herein by reference.

BACKGROUND

Radar systems use electromagnetic signals to detect and track objects. For many applications (e.g., on automobiles), engineers face challenges with electromagnetic interference and thermal management in packaging the electrical components of the radar system. For example, a monolithic microwave integrated circuit (MMIC), processor, and/or power-supply circuits of the radar system are generally shielded from electromagnetic interference. Thermal energy from the MIMIC and other circuitry is generally distributed throughout the radar system to prevent localized heating, which can exceed temperature limitations of the silicon components and the printed circuit board (PCB). As manufacturers add more components to the PCB of a radar system, it is desirable to provide systems and techniques that provide effective shielding from electromagnetic interference and thermal management.

SUMMARY

This document describes techniques and systems for a heatsink shield with thermal-contact dimples of a radar assembly. For example, the radar system can include a PCB, the heatsink shield, a radome, and a housing. The PCB includes a MMIC and a thermally-conductive material covering a portion of a first and a second surface of the PCB. The heatsink shield includes multiple dimples that thermally contact the thermally-conductive material (e.g., copper circuit traces) of the PCB. The heatsink shield is adjacent to the MMIC and at least one of the first or second surface of the PCB. The heatsink shield distributes thermal energy produced at least in part by the MMIC to the housing, which is adjacent to the second surface of the PCB. The radome is adjacent to the heatsink shield and at least a portion of the housing. The radome and the housing encompass the PCB and the heatsink shield.

This document also describes methods performed by the above-summarized system and other methods set forth herein, as well as means for performing these methods and different configurations of this system.

This Summary introduces simplified concepts for a heatsink shield with thermal-contact dimples of a radar assembly, which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of a heatsink shield with thermal-contact dimples for radar systems are described in this document with reference to the following figures. The same numbers are often used throughout the drawings to reference like features and components.

DETAILED DESCRIPTION

Overview

Radar systems are an important sensing technology that some vehicle-based systems rely on to acquire information about the surrounding environment. Some radar systems can be susceptible to overheating and electromagnetic-interference, which causes issues around thermal management and shielding.

Some radar systems rely on thru-board heatsinking to distribute thermal energy generated by a MMIC (or other discrete components) out through a housing and other portions of a radar assembly. Thermal management this way can be especially difficult when the MMIC is mounted on a same side of a PCB as a radome (also referred to as the "radome-side" of a PCB). In such implementations, thru-board heatsinking may not be possible because the PCB can include other discrete components, including those located on the other side of the PCB opposite the MMIC.

In contrast, this document describes techniques and systems to improve thermal management in radar systems through a heatsink shield. For example, a radar assembly can include a heatsink shield that extends to unpopulated areas of the PCB and thermally connects to its ground plane. Thermal dimples on the heatsink shield thermally connect to the PCB. Applied pressure from sealing an enclosure that contains the radar system can ensure thermal contact of the dimples to the surface of the PCB. In this way, the described heatsink shield transfers thermal energy produced at least in part by the MMIC and other discrete components to the housing-side of the PCB (with thermal vias) and the housing. The described heatsink shield with thermal-contact dimples may permit the radar assembly to distribute thermal energy better away from relatively-hot components (e.g., the MMIC) and to the rest of the PCB and the housing, than other thermal management techniques. The described heatsink shield may also enable the radar assembly to be manufactured in fewer steps than other radar assemblies that require, for example, soldering of a shield frame and placement of the shield frame. In addition, the described systems and techniques can simplify the underfill and corner bond dispensing process because full access to the ball-grid-assembly (BGA) package can be obtained.

This is just one example of how the described techniques and systems provide a heatsink shield with dimples for a radar assembly. This document describes other examples and configurations.

Operating Environment

Figure 1:
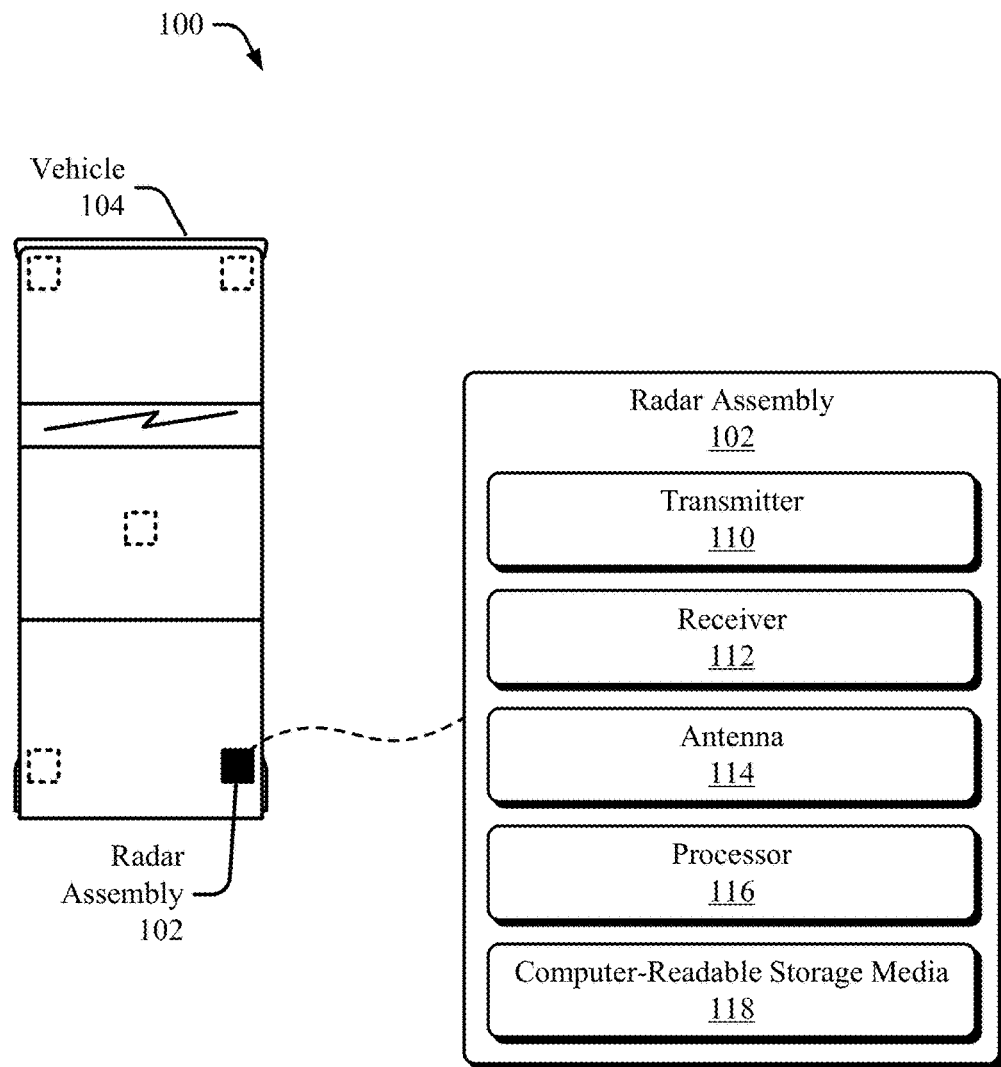
FIG. 1 illustrates an example environment in which a radar assembly with a heatsink shield with thermal-contact dimples can be implemented.
Figure 1:
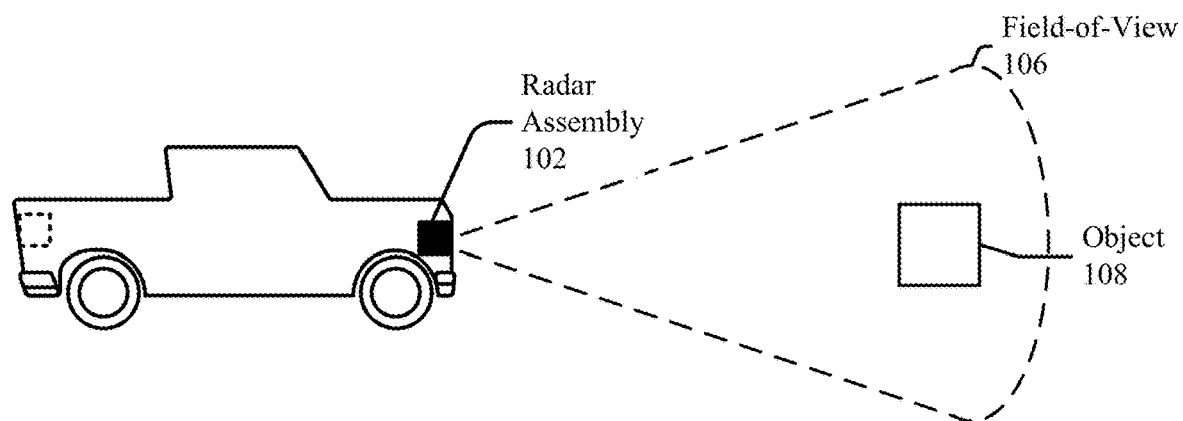

FIG. 1 illustrates an example environment 100 in which a radar assembly 102 with a heatsink shield with dimples can be implemented. In the depicted environment 100, the radar assembly 102 is mounted to, or integrated within, a vehicle 104. The radar assembly 102 is capable of detecting one or more objects 108 that are in proximity to the vehicle 104.

Although illustrated as a car, the vehicle 104 can represent other types of motorized vehicles (e.g., a motorcycle, a bus, a tractor, a semi-trailer truck, or construction equipment), non-motorized vehicles (e.g., a bicycle), railed vehicles (e.g., a train or a trolley car), watercraft (e.g., a boat or a ship), aircraft (e.g., an airplane or a helicopter), or spacecraft (e.g., satellite). In general, manufacturers can mount the radar assembly 102 to any moving platform, including moving machinery or robotic equipment.

In the depicted implementation, the radar assembly 102 is mounted on the front of the vehicle 104 and provides a field-of-view 106 illuminating the one or more objects 108. The radar assembly 102 can project the field-of-view 106 from any exterior surface of the vehicle 104. For example, vehicle manufacturers can integrate the radar assembly 102 into a bumper, side mirror, headlights, rear lights, or any other interior or exterior location where the object 108 requires detection. In some cases, the vehicle 104 includes multiple radar assemblies 102, such as a first radar assembly 102 and a second radar assembly 102 that together provide a larger field-of-view 106. In general, vehicle manufacturers can design the locations of the one or more radar assemblies 102 to provide a particular field-of-view 106 that encompasses a region of interest in which the object 108 may be present. Example fields-of-view 106 include a 360-degree field-of-view, one or more 180-degree fields-of-view, one or more 90-degree field-of-view, and so forth, which can overlap or be combined into a field-of-view 106 of a particular size.

The object 108 is composed of one or more materials that reflect radar signals. Depending on the application, the object 108 can represent a target of interest. In some cases, the object 108 can be a moving object or a stationary object. The stationary objects can be continuous (e.g., a concrete barrier, a guard rail) or discontinuous (e.g., a traffic cone) along a portion of the road.

The radar assembly 102 emits electromagnetic radiation by transmitting one or more electromagnetic signals or waveforms via active elements. In the environment 100, the radar assembly 102 can detect and track the object 108 by transmitting and receiving one or more radar signals. As an example, the radar assembly 102 can transmit electromagnetic signals between 100 and 400 gigahertz (GHz), between 4 and 100 GHz, or between approximately 70 and 80 GHz.

The radar assembly 102 can determine a distance to the object 108 based on a time it takes for the signals to travel from the radar assembly 102 to the object 108, and from the object 108 back to the radar assembly 102. The radar assembly 102 can also determine, based on the direction of a maximum amplitude echo signal received, a location of the object 108 in terms of an angle.

The radar assembly 102 can be part of the vehicle 104. The vehicle 104 can also include at least one automotive system that relies on data from the radar assembly 102, including a driver-assistance system, an autonomous-driving system, or a semi-autonomous-driving system. The radar assembly 102 can include an interface to the at least one automotive system, wherein the antenna 114 can output, via the interface, a signal based on electromagnetic energy received by the antenna 114. Generally, the automotive systems use radar data provided by the radar assembly 102 to perform a function. For example, the driver-assistance system can provide blind-spot monitoring and generate an alert that indicates a potential collision with the object 108 that is detected by the radar assembly 102. In this case, the radar data from the radar assembly 102 indicates when it is safe or unsafe to change lanes. The autonomous-driving system may move the vehicle 104 to a particular location on the road while avoiding collisions with the object 108 detected by the radar assembly 102. The radar data provided by the radar assembly 102 can provide information about a distance to and the location of the object 108 to enable the autonomous-driving system to perform emergency braking, perform a lane change, or adjust the speed of the vehicle 104.

The radar assembly 102 includes a transmitter 110 and at least one antenna 114 to transmit electromagnetic signals, and a receiver 112 and the at least one antenna 114 to receive reflected versions of these electromagnetic signals. The transmitter 110 includes components for emitting electromagnetic signals. The receiver 112 includes one or more components to detect the reflected electromagnetic signals. Also sometimes referred to as a transceiver, the transmitter 110 and the receiver 112 can be separated or combined, and may be incorporated together on the same integrated circuit (e.g., a transceiver integrated circuit) or when separated, may be incorporated separately on different integrated circuits. The radar assembly 102 can also include other components and integrated circuits (e.g., a MMIC) to perform mixing, power amplification, low-noise amplification, high-frequency switching, and other functions to the transmitted and/or received electromagnetic signals.

The radar assembly 102 also includes one or more processors 116 and computer-readable storage media (CRM) 118. The processor 116 can be a microprocessor or a system-on-chip. The processor 116 executes instructions stored within the CRM 118. As an example, the processor 116 can process electromagnetic energy received by the antenna 114 and determine the location of the object 108 relative to the radar assembly 102. The processor 116 can also generate radar data for the automotive systems. As an example, the processor 116 can control, based on processed electromagnetic energy from the antenna 114, an autonomous or semi-autonomous driving system of the vehicle 104.

Figure 2:
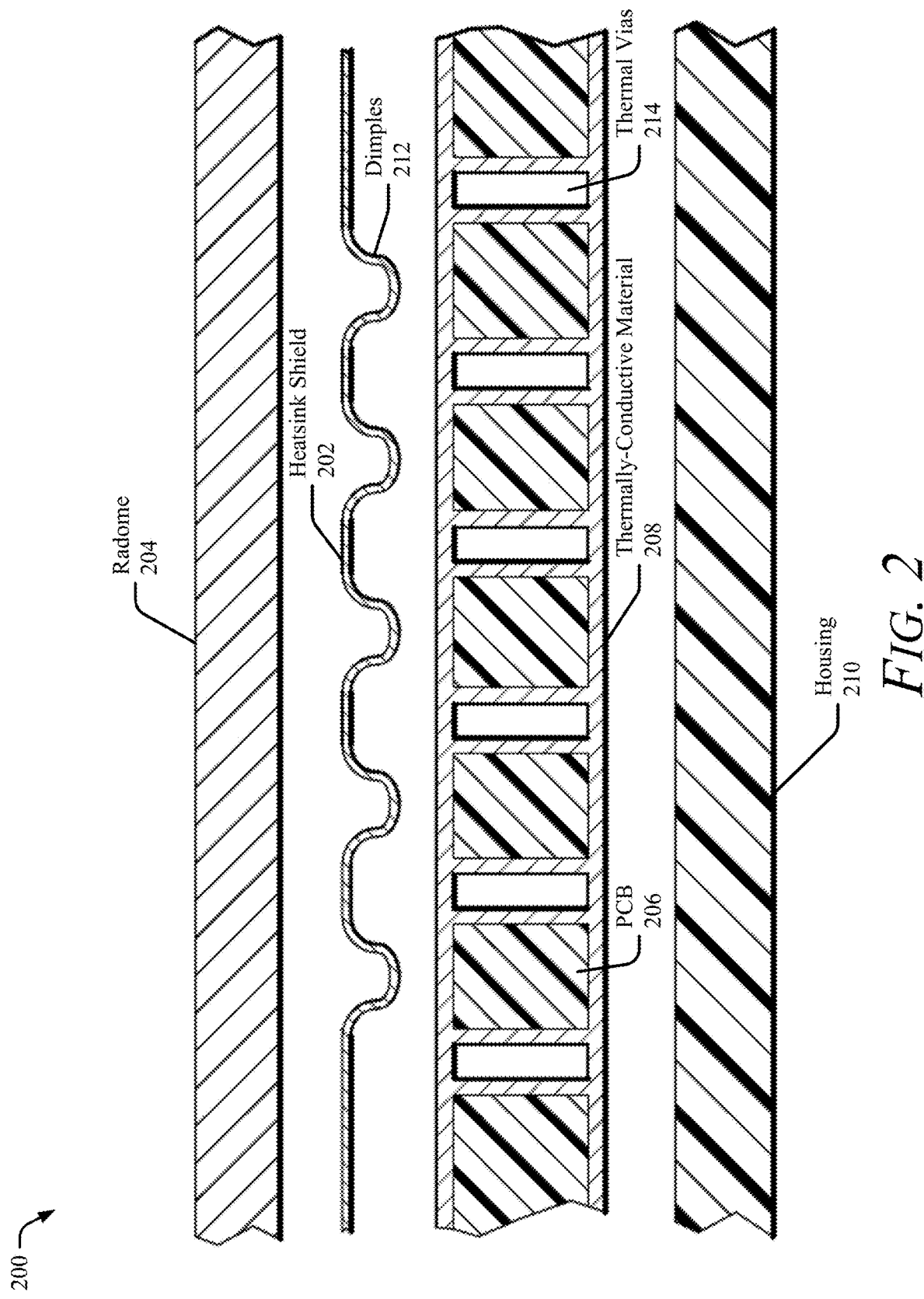
FIGS. 2-4 illustrate exploded, partial cross-sections of example radar assemblies with a heatsink shield with dimples.

FIG. 2 illustrates an exploded, partial cross-section of an example radar assembly 200 with a heatsink shield 202 with dimples 212. The radar assembly 200 includes the heatsink shield 202, a radome 204, a PCB 206, and a housing 210.

The radome 204 can be an enclosure placed adjacent to the heatsink shield 202 and at least a portion of the housing 210. The radome 204 can, for example, be a dielectric material such as plastic. The housing 210 can be a protective structure placed adjacent to a surface of the PCB 206. The housing 210 can be, for example, made of plastic material or plastic material with metal reinforcements. Suitable plastic materials include, as an example, thermoplastics. Using metal reinforcements within the housing 210 can be realized when thermoplastics filled with metal or carbon fillers are chosen as a material for forming the housing 210. The radome 204 and the housing 210 together can form an enclosure around the radar assembly 200.

The PCB 206 is a circuit board to which the transmitter 110, the receiver 112, the antenna 114, the processor 116, and the CRM 118 can be attached. The PCB 206 can be a standard circuit board of flat laminated composite made from non-conductive substrate materials with one or more layers of copper circuitry.

The PCB 206 can include multiple thermal vias 214 between the surfaces of the PCB 206. A thermally-conductive material 208 (e.g., copper circuit traces) covers at least a portion of the surfaces of the PCB 206 and the inner surface(s) of the thermal vias 214. The thermally-conductive material 208 can also cover the distal ends of the thermal vias 214, as illustrated in FIG. 2. The thermally-conductive material 208 can be metal, including, for example, a copper alloy, and cover unpopulated areas of the surfaces of the PCB 206.

The heatsink shield 202 includes multiple dimples 212, which thermally contact the thermally-conductive material 208 of the PCB 206. The heatsink shield 202 distributes thermal energy produced by components of the radar assembly 200 (e.g., the processor 116, an integrated circuit, a MMIC) away from the components and to the housing 210 via the thermally-conductive material 208 and the thermal vias 214. The heatsink shield 202 can extend to unpopulated areas of the PCB 206 and thermally connects via the thermally-conductive material 208 to a ground plane of the PCB 206. The heatsink shield 202 can be metal, including a copper alloy or a copper alloy with a nickel-gold plating.

Figure 3:
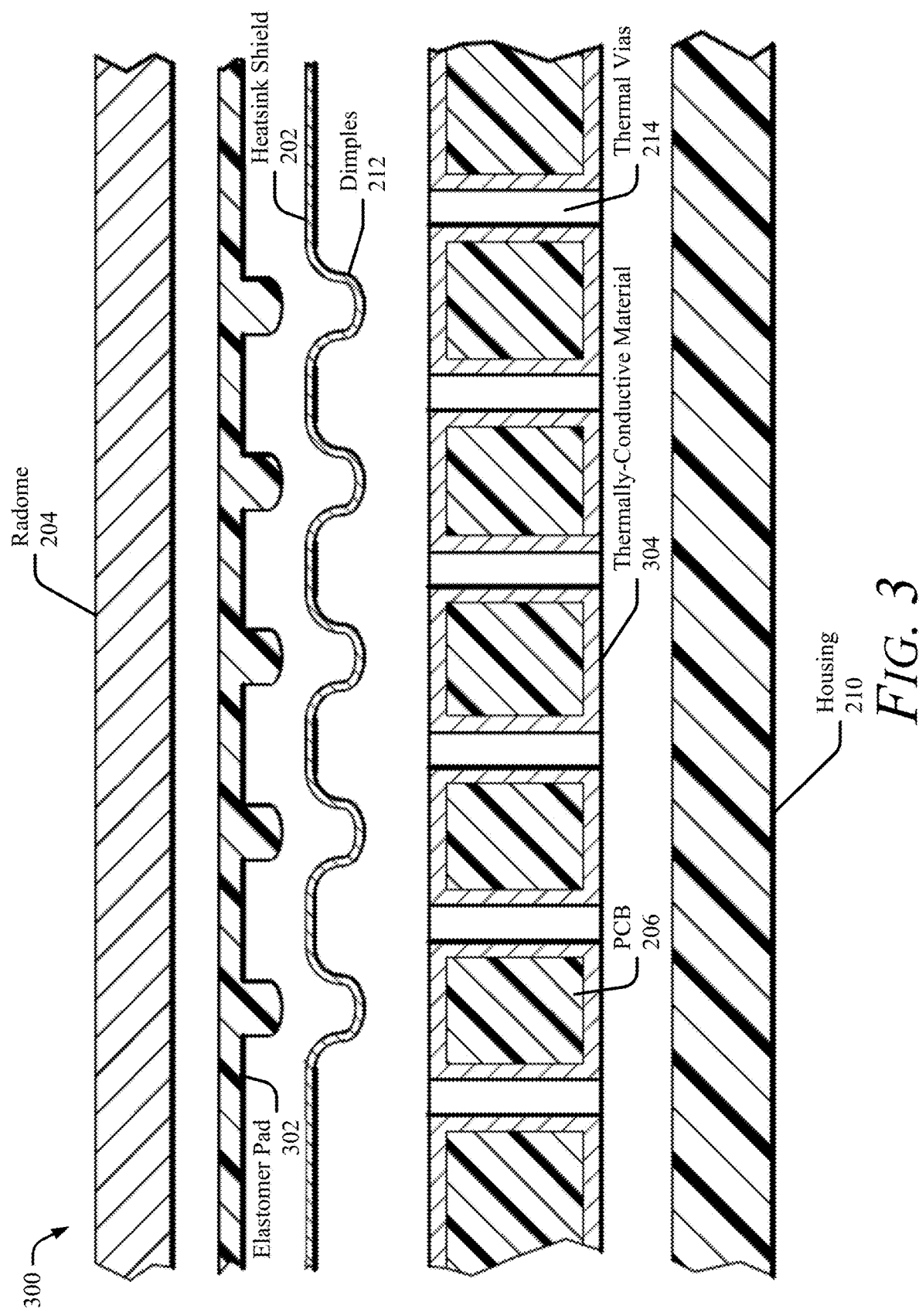

FIG. 3 illustrates an exploded, partial cross-section of another example radar assembly 300 with the heatsink shield 202 with the dimples 212. The radar assembly 300 is similar to the radar assembly 200 of FIG. 2. Like the radar assembly 200 of FIG. 2, the radar assembly 300 includes the heatsink shield 202, the radome 204, the PCB 206, and the housing 210.

Similar to FIG. 2, a thermally-conductive material 304 covers at least a portion of the surfaces of the PCB 206 and the inner surface of the thermal vias 214. In this implementation, the thermally-conductive material 304 does not cover the distal ends of the thermal vias 214.

The radar assembly 300 also includes an elastomer pad 302 positioned between the radome 204 and the heatsink shield 202. The elastomer pad 302 can include dimples configured to fit within the recesses created by the dimples 212 of the heatsink shield 202. The elastomer pad 302 can provide sufficient pressure in the radar assembly 300 to compress the heatsink shield 202 against the thermally-conductive material 304 of the PCB 206.

Figure 4:
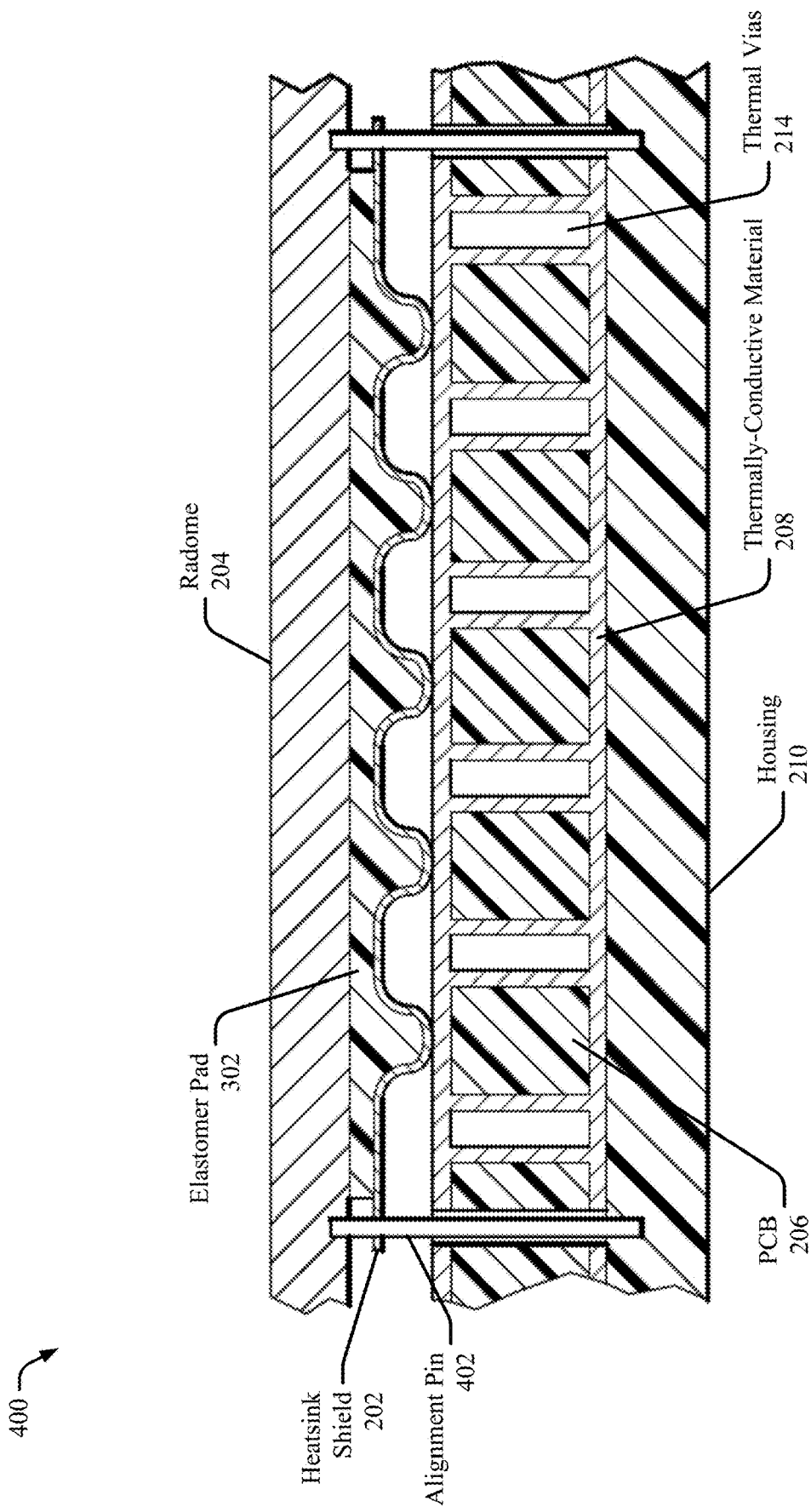

FIG. 4 illustrates a partial cross-section of an example radar assembly 400 with the heatsink shield 202 with dimples. The radar assembly 400 is similar to the radar assembly 200 of FIG. 2 and the radar assembly 300 of FIG. 3. Like the radar assembly 300, the radar assembly 400 includes the heatsink shield 202, the radome 204, the PCB 206, the housing 210, and the elastomer pad 302.

The thermally-conductive material 208 covers at least a portion of the surfaces of the PCB 206 and the inner surface(s) of the thermal vias 214. In this implementation, the thermally-conductive material 208 also covers the distal ends of the thermal vias 214.

The radar assembly 400 also includes multiple alignment pins 402, for example, projecting from a surface of the heatsink shield 202, the radome 204, and/or the housing 210. The alignment pins 402 can align the heatsink shield 202 to the PCB 206, the radome 204, and the housing 210. The alignment pins 402 can pass through the heatsink shield 202 and the PCB 206 amongst dimples of the heatsink shield 202. The alignment pins 402 can also be partially embedded in the radome 204 and the housing 210.

Figure 5:
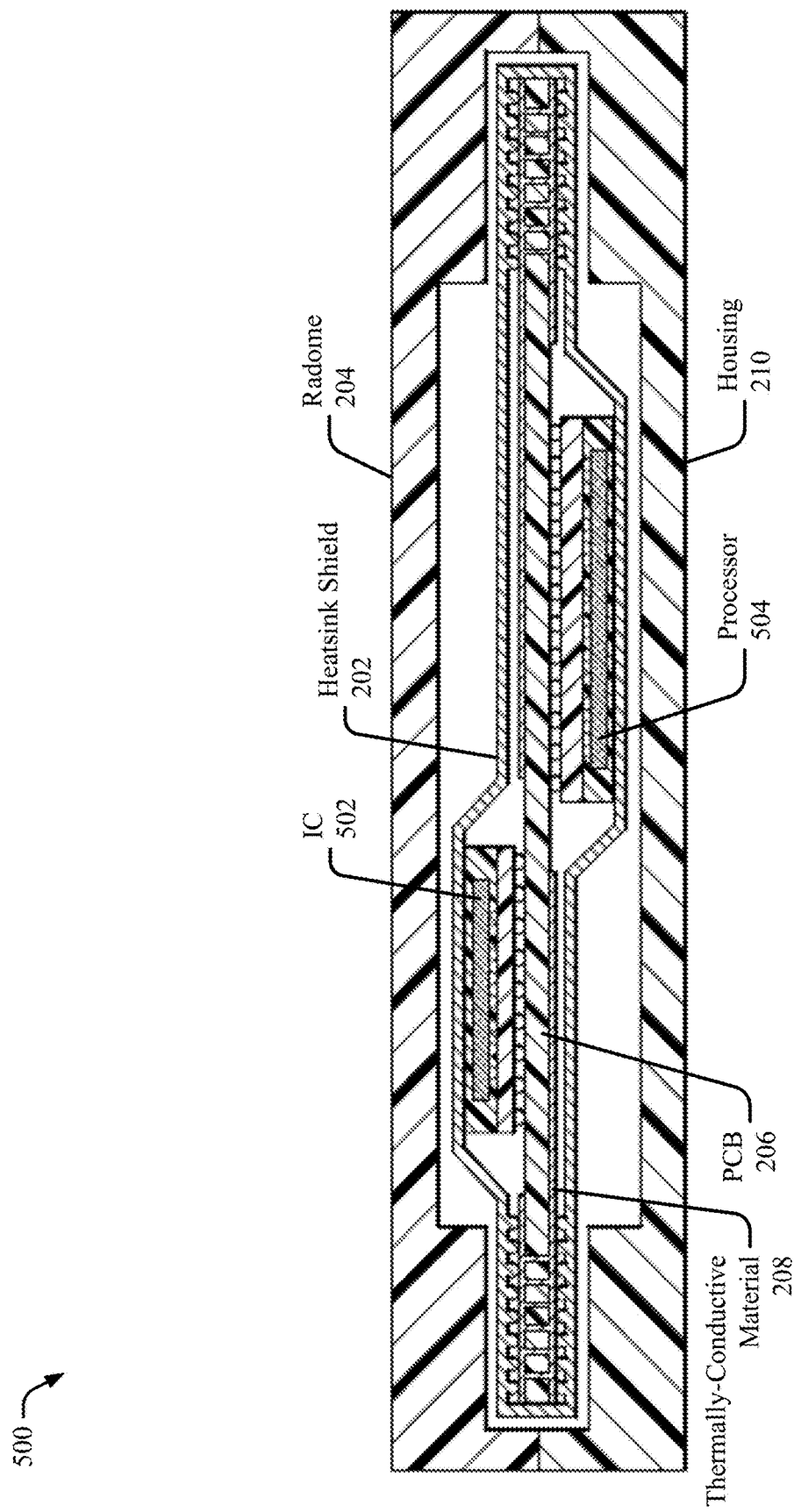
FIGS. 5-7 illustrate a cross-section of example radar assemblies with a heatsink shield with dimples.

FIG. 5 illustrates a cross-section of an example radar assembly 500 with a heatsink shield 202 with dimples. The dimples can have an approximately spherical shape. As non-limiting examples, the dimples can also be arranged in an aligned or staggered pattern, with a depth of approximately 0.25 to 0.50 mm, a diameter of approximately 1 mm, and a pitch of approximately 2.5 mm. The radar assembly 500 is similar to the radar assembly 200 of FIG. 2. Like the radar assembly 200, the radar assembly 500 includes the heatsink shield 202, the radome 204, the PCB 206, and the housing 210.

The radar assembly 500 can also include an integrated circuit (IC) 502 and a processor 504. The IC 502 can, for example, be a MMIC. The IC 502 can operably connect via a BGA to a circuit board, which operably connects via another BGA to a surface of the PCB 206. As illustrated in FIG. 5, the thermally-conductive material 208 does not cover the surface of the PCB 206 under the IC 502 to avoid interfering with the connection between the IC 502 and PCB 206.

The processor 504 can, for example, be a microprocessor. Similar to the IC 502, the processor 504 can operably connect via a BGA to a circuit board, which operably connects via another BGA to a surface of the PCB 206. In this implementation, the processor 504 connects to a different surface of the PCB 206 than the IC 502. In other implementations, the processor 504 and the IC 502 can connect to the same surface of the PCB 206. The thermally-conductive material 208 does not cover the surface of the PCB 206 under the processor 504.

In the depicted implementation, the processor 504 is positioned nearly opposite the IC 502. In this implementation or other implementations, other discrete components (not illustrated in FIG. 5) can be positioned on the other surface of the PCB 206 opposite the IC 502. In such implementations, thru-board heatsinking may not be possible. The heatsink shield 202, however, can distribute thermal energy from the IC 502 and the processor 504 to the housing 210. In this way, the heatsink shield 202 can avoid over-temperature conditions.

Figure 6:
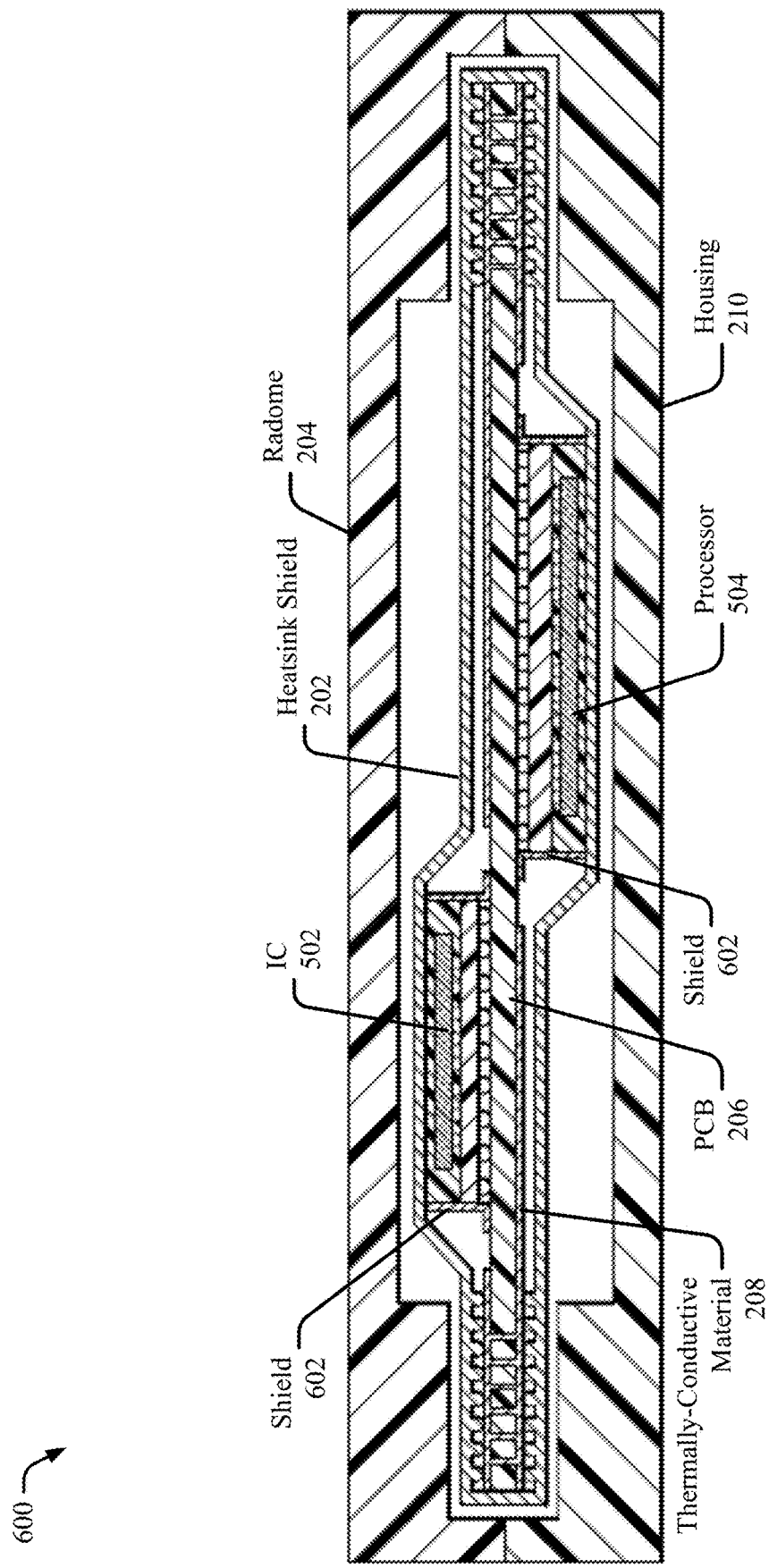

FIG. 6 illustrates a cross-section of another example radar assembly 600 with a heatsink shield 202 with dimples. The radar assembly 600 is similar to the radar assembly 500 of FIG. 5. Like the radar assembly 500, the radar assembly 600 includes the heatsink shield 202, the radome 204, the PCB 206, the housing 210, the IC 502, and the processor 504.

The radar assembly 600 also includes a shield 602 positioned around the IC 502 and the processor 504. The shield 602 can increase the structural strength of the radar assembly 600. The shield 602 can also provide additional shielding from electromagnetic interference to the IC 502 and the processor 504.

Figure 7:
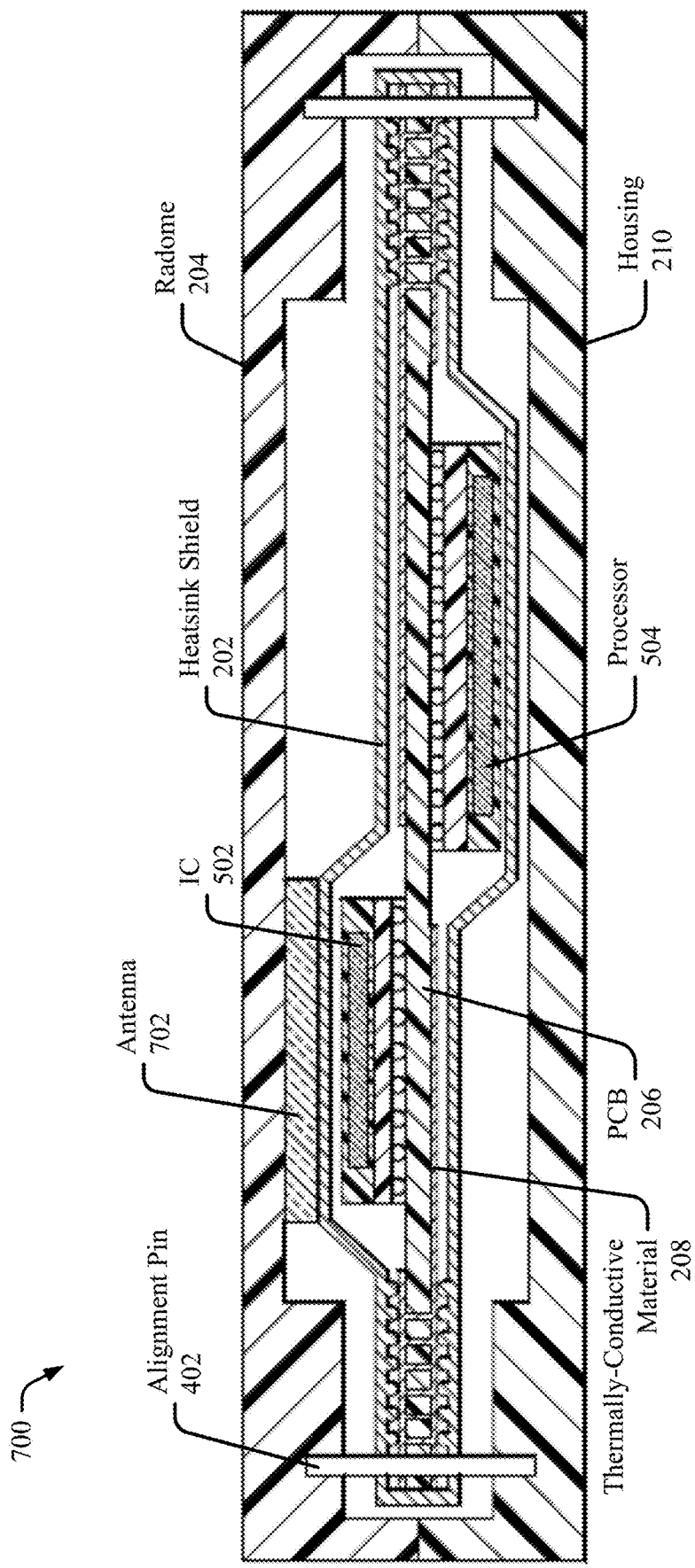

FIG. 7 illustrates a cross-section of another example radar assembly 700 with a heatsink shield 202 with dimples. The radar assembly 700 is similar to the radar assembly 500 of FIG. 5. Like the radar assembly 500, the radar assembly 700 includes the heatsink shield 202, the radome 204, the PCB 206, the housing 210, the IC 502, and the processor 504. Similar to the radar assembly 400 of FIG. 4, the radar assembly 700 also includes alignment pins 402.

The radar assembly 700 can also include an antenna 702. In some implementations, the antenna 702 can be a stamped antenna waveguide. The antenna 702 can be positioned between the radome 204 and the heatsink shield 202. In some implementations, the antenna 702 is incorporated into the heatsink shield 202.

Example Method

Figure 8:
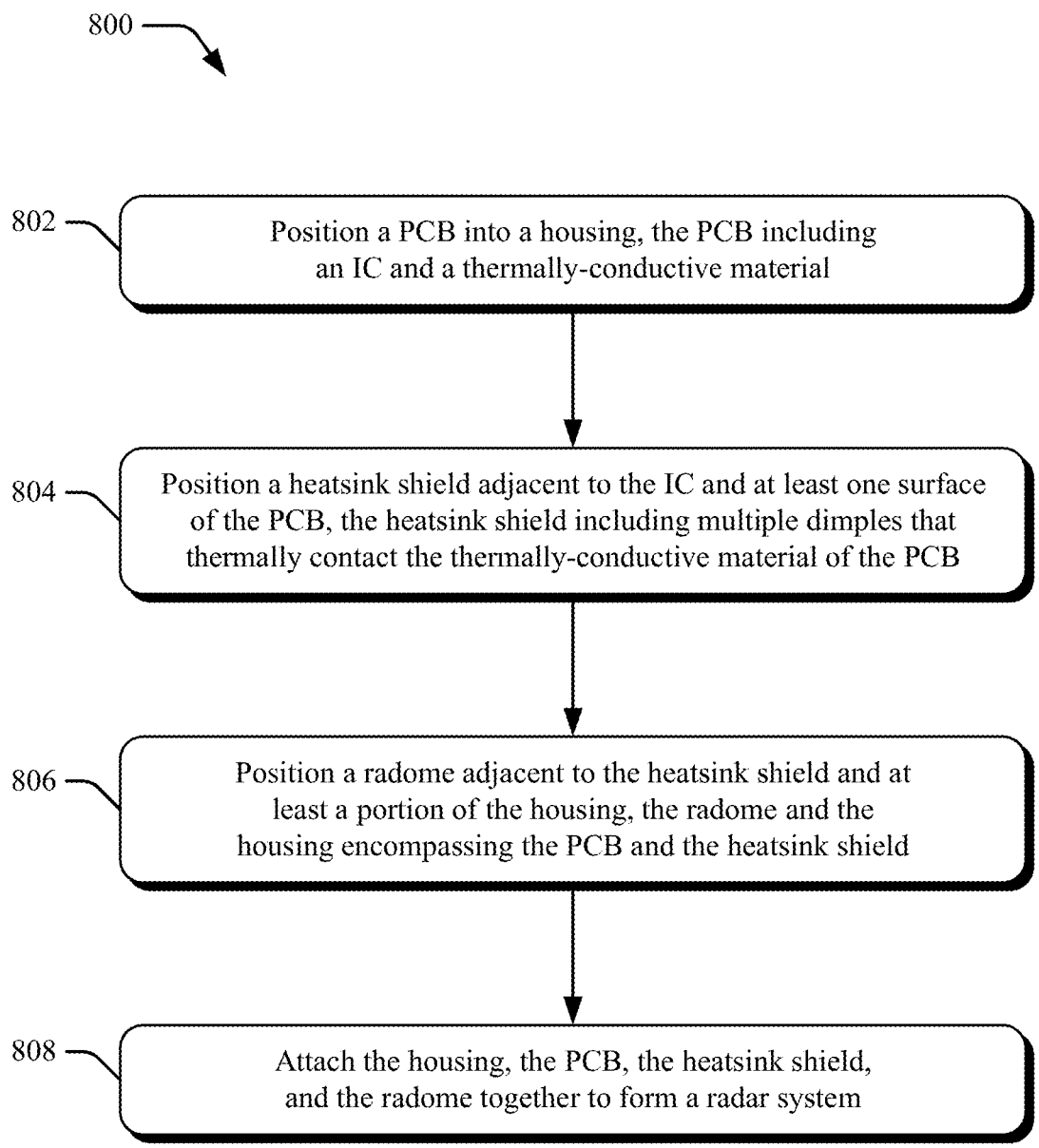
FIG. 8 depicts an example method of assembling a radar system with a heatsink shield with dimples.

FIG. 8 depicts an example method 800 of assembling a radar assembly 102 with a heatsink shield 202 with the dimples 212. Method 800 is shown as sets of operations (or acts) performed, but not necessarily limited to the order or combination in which the operations are shown herein. Further, any of one or more of the operations may be repeated, combined, or reorganized to provide other methods. In portions of the following discussion, reference may be made to the radar assembly 102 of FIG. 1 or the radar assemblies 200 and 500 of FIGS. 2 and 5, respectively, and entities detailed therein, reference to which is made for example only. The techniques are not limited to performance by one entity or multiple entities.

At 802, a PCB is positioned into a housing. The PCB includes an IC and a thermally-conductive material that covers at least a portion of a first surface and a second surface of the PCB. The housing is adjacent to the second surface of the PCB. For example, the radar assembly 102 includes the PCB 206 positioned into the housing 210. The PCB 206 includes the IC 502 and the thermally-conductive material 208 that covers at least a portion of the first surface and the second surface of the PCB 206. The second surface of the PCB 206 is opposite the first surface of the PCB 206. The housing 210 is adjacent to the second surface of the PCB 206.

At 804, a heatsink shield is positioned adjacent to the IC and at least one of the first surface or the second surface of the PCB. The heatsink shield includes multiple dimples that thermally contact the thermally-conductive material of the PCB. The heatsink shield is configured to distribute thermal energy produced by the IC to the housing. For example, the radar assembly 102 also includes the heatsink shield 202 positioned adjacent to the IC 502 and at least one of the first surface or the second surface of the PCB 206. The heatsink shield 202 includes multiple dimples 212 that thermally contact the thermally-conductive material 208 of the PCB 206. The heatsink shield 202 is configured to distribute thermal energy produced by the IC 502 to the housing 210.

At 806, a radome is positioned adjacent to the heatsink shield and at least a portion of the housing. The radome and the housing encompass the PCB and the heatsink shield. For example, the radar assembly 102 also includes the radome 204, which is positioned adjacent to the heatsink shield 202 and at least a portion of the housing 210. The radome 204 and the housing 210 encompass the PCB 206 and the heatsink shield 202 to form the radar assembly 102.

At 808, the housing, the PCB, the heatsink shield, and the radome are attached to form the radar system. For example, the housing 210, the PCB 206, the heatsink shield 202, and the radome 204 are attached, including by laser welding, to form the radar assembly 102. Alignment pins 402 can be used to align the housing 210, the PCB 206, and the heatsink shield 202.

Examples

In the following section, examples are provided.

Example 1: A radar assembly comprising: a printed circuit board (PCB) that includes an integrated circuit (IC) and a thermally-conductive material that covers at least a portion of a first surface of the PCB and at least a portion of a second surface of the PCB opposite the first surface of the PCB; a heatsink shield that includes multiple dimples that thermally contact the thermally-conductive material of the PCB, the heatsink shield being adjacent to the IC and at least one of the first surface of the PCB or the second surface of the PCB, the heatsink shield being configured to distribute thermal energy produced at least in part by the IC to a housing adjacent to the second surface of the PCB; and a radome adjacent to the heatsink shield and at least a portion of the housing, the radome and the housing encompassing the PCB and the heatsink shield.

Example 2: The radar assembly of example 1, the radar assembly further comprising: multiple alignment pins configured to align for assembly, the PCB, the heatsink shield, and the housing.

Example 3: The radar assembly of example 2, wherein the multiple alignment pins pass through the heatsink shield amongst at least some of the multiple dimples.

Example 4: The radar assembly of example 2, the radar assembly further comprising: an elastomer pad positioned between the radome and the heatsink shield to provide sufficient pressure in the radar assembly to compress the heatsink shield against the thermally-conductive material of the PCB, the elastomer pad including dimples configured to fit within recesses created by the dimples of the heatsink shield.

Example 5: The radar assembly of example 1, the radar assembly further comprising: an antenna positioned between the radome and the heatsink shield.

Example 6: The radar assembly of example 1, wherein: the IC is a monolithic microwave integrated circuit (MMIC) and is positioned on the first surface of the PCB; the PCB further includes multiple thermal vias between the first surface of the PCB and the second surface of the PCB, the multiple thermal vias configured to distribute thermal energy produced at least in part by the MMIC from the first surface of the PCB to the second surface of the PCB; and the thermally-conductive material covers an inner surface of the thermal vias.

Example 7: The radar assembly of example 6, wherein the thermally-conductive material also covers a first distal end and a second distal end of the thermal vias to distribute the thermal energy produced at least in part by the MMIC along the first surface of the PCB.

Example 8: The radar assembly of example 6, wherein a first distal end and a second distal end of the thermal vias are not covered by the thermally-conductive material.

Example 9: The radar assembly of example 1, wherein: the housing includes a thermoplastic; the thermally-conductive material comprises circuit traces; and the thermally-conductive material and the heatsink shield are metal.

Example 10: The radar assembly of example 9, wherein the thermally-conductive material and the heatsink shield include a copper alloy.

Example 11: The radar assembly of example 1, wherein the thermally-conductive material covers unpopulated areas of the first surface of the PCB and the second surface of the PCB to avoid interfering with a connection between the IC and the PCB.

Example 12: The radar assembly of example 11, wherein the thermally-conductive material does not cover populated areas of the first surface of the PCB and the second surface of the PCB.

Example 13: The radar assembly of example 1, wherein the dimples have a depth of approximately 0.25 to 0.50 millimeters, a diameter of approximately 1 millimeter, and a pitch of approximately 2.5 millimeters.

Example 14: The radar assembly of example 1, wherein the dimples are arranged in an aligned or staggered pattern on the heatsink shield.

Example 15: A method of assembling a radar system, the method comprising: positioning a printed circuit board (PCB) into a housing, the PCB including an integrated circuit (IC) and a thermally-conductive material that covers at least a portion of a first surface of the PCB and at least a portion of a second surface of the PCB opposite the first surface of the PCB, the housing being adjacent to the second surface of the PCB; positioning a heatsink shield adjacent to the IC and at least one of the first surface of the PCB or the second surface of the PCB, the heatsink shield including multiple dimples that thermally contact the thermally-conductive material of the PCB and being configured to distribute thermal energy produced at least in part by the IC to the housing; positioning a radome adjacent to the heatsink shield and at least a portion of the housing, the radome and the housing encompassing the PCB and the heatsink shield; and attaching together the housing, the PCB, the heatsink shield, and the radome to form the radar system.

Example 16: The method of example 15, the method further comprising: aligning, using multiple alignment pins, the PCB, the heatsink shield, and the housing.

Example 17: The method of example 16, the method further comprising: positioning an elastomer pad between the radome and the heatsink shield to provide sufficient pressure in the radar system to compress the heatsink shield against the thermally-conductive material of the PCB, the elastomer pad including dimples configured to fit within recesses created by the dimples of the heatsink shield.

Example 18: The method of example 15, the method further comprising: positioning an antenna between the radome and the heatsink shield.

Example 19: The method of example 15, wherein: the IC is a monolithic microwave integrated circuit (MMIC) and is positioned on the first surface of the PCB; the PCB further includes multiple thermal vias between the first surface of the PCB and the second surface of the PCB, the multiple thermal vias configured to distribute thermal energy produced at least in part by the MMIC from the first surface of the PCB to the second surface of the PCB; and the thermally-conductive material covers an inner surface of the thermal vias.

Example 20: The method of example 15, wherein: the IC is positioned on the first surface of the PCB; the PCB further includes a processor positioned on the second surface of the PCB and approximately opposite the IC; and the heatsink shield is positioned adjacent to both the first surface of the PCB and the second surface of the PCB.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

What is claimed is:

1. An assembly comprising:
a printed circuit board (PCB) that includes one or more components and a thermally-conductive material that covers at least a portion of a first surface of the PCB and at least a portion of a second surface of the PCB opposite the first surface of the PCB; and
a heatsink shield that includes multiple dimples in direct mechanical contact with the thermally-conductive material of the PCB on both the first surface and second surface of the PCB, the heatsink shield being adjacent to the one or more components and the first surface of the PCB, the heatsink shield being configured to distribute thermal energy produced at least in part by the one or more components to a housing positioned adjacent to the second surface of the PCB.

2. The assembly of claim 1, the assembly further comprising:
multiple alignment pins that pass through the heatsink shield amongst at least some of the multiple dimples, the multiple alignment pins aligning the PCB, the heatsink shield, and the housing.

3. The assembly of claim 2, wherein the alignment pins partially embed a radome adjacent to a portion of the housing, the radome and the housing encompassing the PCB and the heatsink shield.

4. The assembly of claim 1, the assembly further comprising:
a radome adjacent to a portion of the housing, the radome and the housing encompassing the PCB and the heatsink shield; and
an elastomer pad positioned between the radome and the heatsink shield that compresses the heatsink shield against the thermally-conductive material of the PCB, the elastomer pad including dimples that fit within recesses created by the dimples of the heatsink shield.

5. The assembly of claim 1, wherein:
the one or more components include a monolithic microwave integrated circuit (MMIC) positioned on the first surface of the PCB;
the PCB further includes multiple thermal vias between the first surface and the second surface, the multiple thermal vias configured to distribute thermal energy produced at least in part by the MMIC from the first surface to the second surface; and
the thermally-conductive material covers an inner surface of the thermal vias.

6. The assembly of claim 5, wherein the thermally-conductive material also covers a first distal end and a second distal end of the thermal vias to distribute the thermal energy produced at least in part by the MMIC along the first surface.

7. The assembly of claim 1, wherein:
the one or more components include a monolithic microwave integrated circuit (MMIC) positioned on the first surface of the PCB and a processor positioned on the second surface of the PCB; and
the heatsink shield is configured to distribute thermal energy produced by the MMIC and the processor to the housing.

8. The assembly of claim 7, wherein at least a portion of the processor is positioned opposite at least a portion of the MMIC.

9. The assembly of claim 1, wherein:
the one or more components include a monolithic microwave integrated circuit (MMIC) and a processor both positioned on the first surface of the PCB; and
the PCB further includes multiple thermal vias between the first surface and the second surface, the multiple thermal vias configured to distribute thermal energy produced at least in part by the MMIC and the processor from the first surface to the second surface.

10. The assembly of claim 1, wherein the thermally-conductive material and the heatsink shield comprise a copper alloy.

11. The assembly of claim 1, wherein the dimples are arranged in an aligned or staggered pattern on the heatsink shield.

12. The assembly of claim 1, wherein the dimples have an approximately spherical shape.

13. A method of assembling a system, the method comprising:

positioning a printed circuit board (PCB) into a housing, the PCB including one or more components and a thermally-conductive material that covers at least a portion of a first surface of the PCB and at least a portion of a second surface of the PCB opposite the first surface of the PCB, the housing being adjacent to the second surface of the PCB;

positioning a heatsink shield adjacent to the one or more components and the first surface of the PCB, the heatsink shield including multiple dimples in direct mechanical contact with the thermally-conductive material of the PCB on both the first surface and second surface of the PCB and being configured to distribute thermal energy produced at least in part by the one or more components to the housing, the multiple dimples having an approximately spherical shape; and attaching together the housing, the PCB, and the heatsink shield to form the system.

14. The method of claim 13, the method further comprising:

aligning, using multiple alignment pins, the PCB, the heatsink shield, and the housing, the multiple alignment pins passing through the heatsink shield amongst at least some of the multiple dimples.

15. The method of claim 14, wherein the alignment pins are partially embedded a radome adjacent to a portion of the housing, the radome and the housing encompassing the PCB and the heatsink shield.

16. The method of claim 15, the method further comprising:

positioning an elastomer pad between the radome and the heatsink shield that compresses the heatsink shield against the thermally-conductive material of the PCB, the elastomer pad including dimples that fit within recesses created by the dimples of the heatsink shield.

17. The method of claim 13, wherein the dimples have an approximately spherical shape.

18. The method of claim 13, wherein the dimples are arranged in an aligned or staggered pattern on the heatsink shield.

19. The method of claim 13, wherein:

the one or more components include a monolithic microwave integrated circuit (MMIC) positioned on the first surface of the PCB;

the PCB further includes multiple thermal vias between the first surface and the second surface, the multiple thermal vias configured to distribute thermal energy produced at least in part by the MMIC from the first surface to the second surface; and the thermally-conductive material covers an inner surface of the thermal vias.

20. The method of claim 13, wherein:

the one or more components include a monolithic microwave integrated circuit (MMIC) positioned on the first surface of the PCB and a processor positioned on the second surface of the PCB; and the heatsink shield is positioned adjacent to both the first surface and the second surface of the PCB and configured to distribute thermal energy produced by the MMIC and the processor to the housing.

\* \* \* \* \*